United States Patent
Hamzehdoost et al.

(10) Patent No.: US 6,264,778 B1
(45) Date of Patent: Jul. 24, 2001

(54) REINFORCED SEALING TECHNIQUE FOR AN INTEGRATED CIRCUIT PACKAGE

(75) Inventors: Ahmad Hamzehdoost, Sacramento; Leonard Lucio Mora, San Jose, both of CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 08/282,222

(22) Filed: Jul. 29, 1994

Related U.S. Application Data

(63) Continuation of application No. 07/951,078, filed on Sep. 25, 1992, now abandoned.

(51) Int. Cl.[7] .............................. B32B 31/06; H01L 23/10
(52) U.S. Cl. .......................... 156/91; 156/92; 156/291; 156/292; 156/293; 174/52.4
(58) Field of Search ................... 156/91, 92, 69, 156/291, 292, 293; 174/52.4; 257/678

(56) References Cited

U.S. PATENT DOCUMENTS

| | | | |
|---|---|---|---|
| 3,906,144 | * | 9/1975 | Wiley .................................. 174/52.4 |
| 4,499,333 | * | 2/1985 | Chee ................................... 174/52.4 |
| 4,635,093 | * | 1/1987 | Ross ................................... 174/52.4 |
| 4,817,273 | * | 4/1989 | Lape ...................................... 29/759 |
| 4,929,505 | * | 5/1990 | Washburn .............................. 156/92 |
| 4,943,686 | * | 7/1990 | Kucharek ........................... 174/52.4 |
| 4,990,720 | * | 2/1991 | Kaufman ............................. 29/592.1 |
| 5,043,534 | * | 8/1991 | Mahulikar .......................... 174/52.4 |
| 5,053,922 | * | 10/1991 | Matta ................................... 361/398 |
| 5,175,410 | * | 12/1992 | Freedman ............................. 29/760 |
| 5,216,583 | * | 6/1993 | Katsumata ........................... 361/395 |

OTHER PUBLICATIONS

The McGraw–Hill Dictionary of Scientific and Technical Terms, 3rd. Ed., McGraw–Hill Book Company, New York, (1984) p. 1563.*

* cited by examiner

Primary Examiner—Michael W. Ball
Assistant Examiner—Michael A. Tolin
(74) Attorney, Agent, or Firm—Patrick T. King

(57) ABSTRACT

One or more reinforcement pins are inserted between the lid and base of a sealed integrated-circuit package. The reinforcement pins reinforce a sealing layer between the lid and the base, particularly against shear forces exerted on the sealing layer between the lid and the base of a package. Shorter pins are provided which do not extend through the lid or base. Longer pins are provided which extend through the lid or base, with the ends of the pins being mechanically secured to the lid or base and sealed with solder, glass, or epoxy material.

16 Claims, 2 Drawing Sheets

US 6,264,778 B1

REINFORCED SEALING TECHNIQUE FOR AN INTEGRATED CIRCUIT PACKAGE

This is a continuation of application(s) Ser. No. 07/951,078 filed on Sep. 25, 1992 now abandoned.

BACKGROUND OF THE INVENTION

1. Field of the Invention.

This invention relates to packaging techniques for integrated circuits and, more particularly, to techniques for sealing an integrated-circuit package.

2. Prior Art

A hermetically-sealed package, or package assembly for an integrated circuit typically includes a base in which is formed a cavity for the integrated-circuit die. The base of the package is formed of a ceramic or a metallic material. A lid of ceramic or metallic material is sealed to the base with an appropriate layer of sealing material, such as glass, solder, or epoxy. Sometimes an intermediate, thin sealing ring is positioned between the base and the lid so that two layers of sealing material are used, one on each side of the sealing ring. Currently, all of the sealing techniques used in packaging of integrated circuits rely upon the adhesion strength of the layer of sealing material. Because of the differences in the temperature coefficients of expansion (TCE) of the various materials used in a package, the adhesion of the sealing material fails and the lids of the packages peel away from their bases. This occurs particularly when a package is subjected to pressure-pot testing or to thermal-cycle testing, where the shear forces cause the sealing materials to fail at the margins between the sealing materials and the package elements.

With variations in temperature, the various components of a package, as well as the sealing layers, expand or contract at different rates so that shear forces are generated at the interfaces between the different elements and the sealing materials. The shear strengths of the sealing materials, such as glass, solder, or epoxy are relatively weak so that failures occur at the margin of the sealing material near the package elements. Typically, an epoxy material fails with a shear pressure of 1 to 5 kpsi. The materials of the package elements such as the base or lid are much stronger under shear loads. For example a metal has a failure shear strength of 10–30 kpsi.

One solution to the problem of lids peeling from packages is to attempt to match the TCE's of the various materials of the package assembly. This is difficult to accomplish and has the disadvantage that more expensive materials often must be used.

The need has arisen for an improved integrated circuit packaging technique which enhances and reinforces currently-used packaging technique by increasing the adhesion strength of adhesive or bonding material between the lid and the base of an integrated-circuit package.

SUMMARY OF THE INVENTION

It is therefore an object of the invention to provide an improved packaging technique for integrated circuits, which techniques increases the performance of the adhesion or bonding layer between the lid and the base of an integrated package.

In accordance with this and other objects of the invention, the invention provides for inserting one or more reinforcement pins between the lid and base of an integrated-circuit package. This invention is applicable to a number of different package types, such as pin-grid-array (PGA), side-brazed, and epoxy-sealed packages of various types. The reinforcement pins are used to reinforce a sealing layer between the lid and the base, particularly when shear forces are exerted on the boundaries between the sealing layer and the lid or base of the package. The length of the reinforcement pins are optional. Shorter pins do not extend through the lid or base. Longer pins can extend through the lid or base and their ends are mechanically secured to the lid or base and sealed with solder, glass, or epoxy material.

The invention provides a package structure and a method of packaging an integrated circuit. An integrated-circuit die is mounted within a cavity formed in a base of a package. A lid is positioned over the integrated-circuit die and the base and lid are sealed with a sealing layer positioned between the base and the lid.

The invention contemplates using at least one reinforcement pin, which extends through the sealing layer and at least partially through the base and at least partially through the lid. The reinforcement pin provides reinforcement for the sealing layer between the base and the lid so that the package can resist shear forces tending to rupture the sealing layer between the lid and the base of the package. The invention is useful with packages which use an intermediate sealing ring between the lid and the base. The reinforcement pin extends through this type of ring and through sealing layers formed adjacent to the top and bottom surfaces of this ring.

A pin extends at least partially through an undersize aperture in the base and at least partially through an undersize aperture in the lid to secure the reinforcement pin to the base and the lid. The pin can extend through either or both of the lid and the base of a package. The extending end or ends of a reinforcement pin are fixed to a lid or base, for example by being stamped, pressed, or punched and sealed with a number of materials, such as solder, glass, or epoxy.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
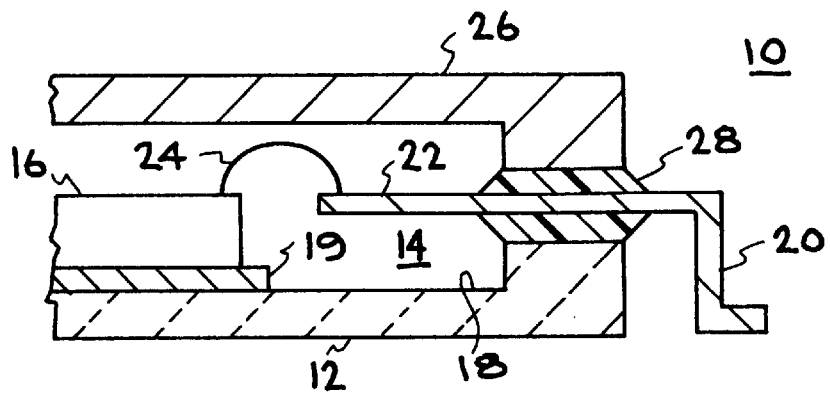
FIG. 1 is a partial sectional view of an epoxy sealed package.

FIG. 1 shows an epoxy-sealed package assembly 10, such as a quad flat pack package. A base 12 has a cavity 14 formed therein for containing an integrated-circuit die 16. The integrated-circuit die 16 is attached to an interior surface 18 of the base 12 using a suitable layer 19 of bonding material, such as silver-filled epoxy material. The base 12 is formed of a metal, FR4, a pre-molded material, or a ceramic material, such as alumina $A_{12}O_3$. A number of metal leads (typically shown as 20) have an inner portion 22 which extends into the cavity 14. Respective bonding wires (typically shown as 24) have one end wire-bonded to respective bonding pads on the top surface of the integrated-circuit die 16. The other end of the respective bonding wires are bonded to the ends of respective metal leads, as indicated in the Figure. A lid 26, formed of gold-plated kovar, aluminum, ceramic material, FR4, or premolded material overlies the cavity 14. The inner portion 22 of a metal lead 20 extends into the cavity 14 through an epoxy seal 28. The epoxy seal 28 serves as a bonding material between the base 12 and the lid 26.

Similarly, for some ceramic packages, the sealing material could be a soft glass. The soft glass seal 28 is, in general, made of lead-zinc-borate material and is sealed at 400–450 degrees Centigrade. The lead-zinc-borate material has a TCE of 8–10 ppm/deg. C. In comparison, ceramic material has a TCE of 5–6 ppm/° C. This mismatch in TCE's is a source of stress in the bonding material, particularly after the package is assembled and is cooled to an ambient operating temperature of 24 degrees C. The bond layer may also have intermetallic layers formed in it due to metal migrating into the glass material. The seal has a mechanical strength of 7–8000 psi. The area stressed is contained within the horizontal and vertical cross-section of the seal area.

Figure 2:
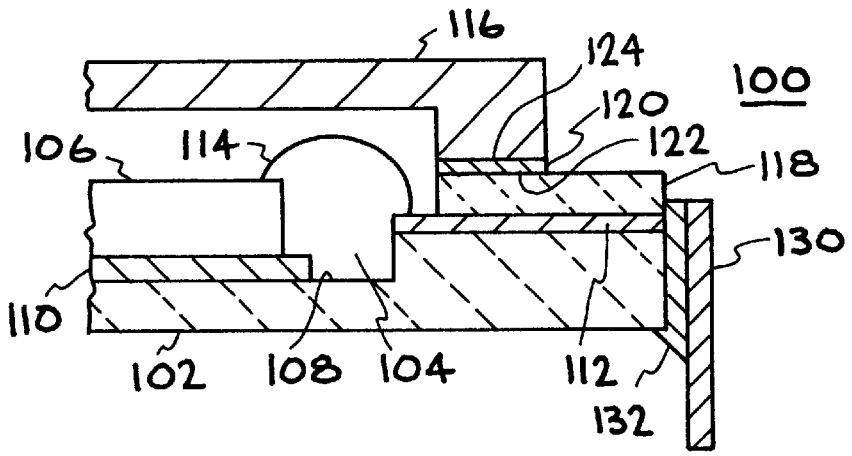
FIG. 2 is a partial sectional view of a side-brazed package, which uses an intermediate sealing ring between the lid and the body of the package.

FIG. 2 shows a sectional view of a side-brazed package 100. A base 102 has a cavity 104 formed therein for containing an integrated-circuit die 106 which is attached to an interior surface 108 of the base 102 using a suitable layer 110 of bonding material, such as gold-silicon eutectic or silver glass. The base is generally formed of a ceramic material, such as alumina $Al_2O_3$. A number of metal traces (typically shown as 112) are deposited on the exterior shoulders of the base 102 adjacent to the cavity 104. These metals traces are formed of molybdenum/tungsten material. Bonding wires (typically shown as 114) have one end wire-bonded to respective bonding pads on the top surface of the integrated-circuit die 106. The other end of the respective bonding wires are bonded to the ends of respective metal leads, as indicated in the Figure. A lid 116, formed of gold-plated kovar or ceramic material, overlies the cavity 104. A ceramic seal ring 118 extend around the base 102 of the package. A soft glass or solder seal 120 is formed between the top surface 122 of the ceramic seal ring 118 and a lower surface 124 of the lid 116.

A metal lead 130 formed of kovar/A42 is brazed or soldered to the side of the base 102 using a layer 132 of material formed of eutectic gold or a tin/lead alloy 80/20 material. Brazed of solder sealing have TCE mismatch problems and inter metallic formations are common. The TCE of tin is 23 ppm/deg. C.; Molybdenum is 4.8 ppm/deg. C.; alumina is 5–6 ppm/deg. C.; and gold is 14ppm/deg. C. A nickel-alloyed, gold-plated is used for good solder or brazing wettability. Very often too much gold is formed and dissolved during the brazing or soldering process, producing poor mechanical strength in the bond. A solder seal is less preferred because of the embrittlement caused by the inter metallic bond, which has half as much strength as a brazed seal. Indium and silver are added to solder seals to match TCE's, reduce shrinkage voids, and increase mechanical strength for fatigue resistance.

Figure 3:
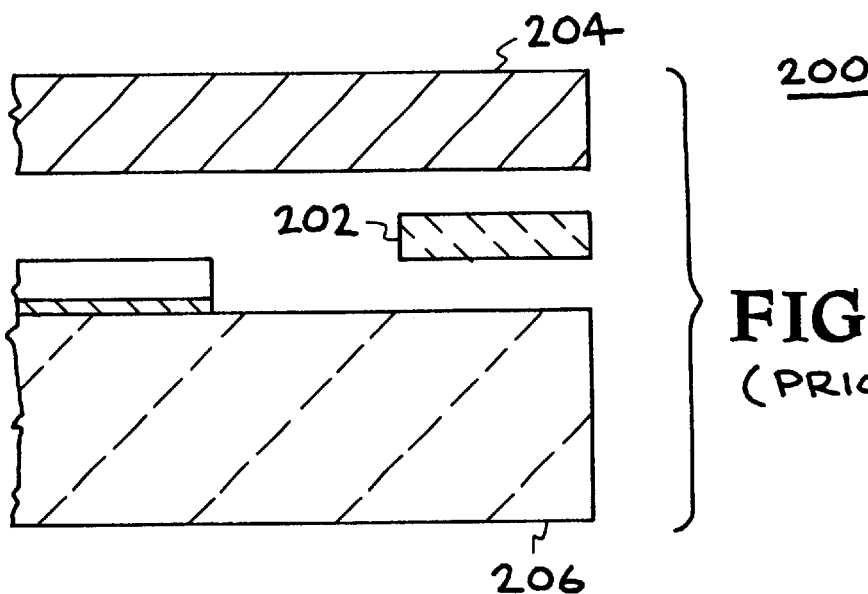
FIG. 3 is a sectional view of package using a ring, which is positioned between the lid and the body of the package.

FIG. 3 illustrates a package assembly 200, which uses a ring 202 intermediate a lid 204 and a body 206, which are assembled at high temperature and cooled to ambient temperature. The lid 204 and body 206 are usually formed of different materials. The lid can be formed of metal, ceramic, or printed circuit board (PCB) material. The body can be formed of metal , plastic, PCB, or premolded material. The TCE mismatch causes shrinkage of the different material at different rates. This produces mechanical stress at the bonding layer. These bonds will fail if these stresses are beyond maximum tolerable limits.

Figure 4:
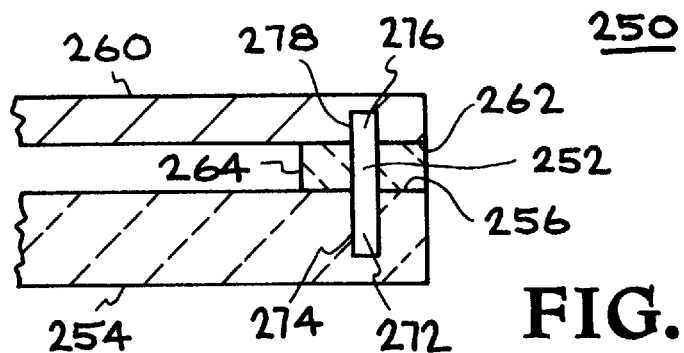
FIG. 4 is a partial sectional view of a package configuration using a reinforcement pin to increase the mechanical strength of the seal for an integrated-circuit package.

FIG. 4 shows a portion of an integrated-circuit package configuration 250, according to the invention. This package configuration uses a reinforcement pin 252 to increase the mechanical strength of the seal for the integrated-circuit package 250. The package includes a base 254 which has a top sealing surface 256 formed around its margins. A lid 260 has a lower sealing surface 262 around its margins. A layer of sealing material 264 is formed between the top sealing surface 256 of the base 254 and the lower sealing surface 262 of the lid 260.

The reinforcement pin 252 serves as a mechanical means for mechanically holding the base 254 and the lid 260 together and provides additional, mechanical sealing between the base and the lid. The reinforcement pin 252 is formed of a metal, such as, for example, gold-plated kovar. The pin 252 extends through the sealing layer 264 and at least partially into the base 254 and at least partially into the lid 260. One end 272 of the reinforcement pin extends through a somewhat undersized aperture 274 formed in the base 254. The other end 276 of the reinforcement pin 270 extends through a somewhat undersized aperture 278 formed in the lid 260. A number of reinforcement pins can be pressed into the base and the lid and are used to provide mechanical reinforcement for the layer of sealing material 264.

The undersized apertures 274, 278 are formed in the base and lid elements of the package using conventional techniques, such as used for the apertures for the leads of a pin-grid-array PGA package for integrated circuit. The internal surfaces of the undersized apertures 274, 278 are coated with a thin layer of material such as tin, gold, or nickel. When reinforcement pins are inserted in the slightly undersize apertures and the assembly is subsequently heated, the reinforcement pins are securely fixed in place. A partial assembly of a lid with some reinforcement pins can be prepared prior to attachment of an integrated-circuit die to a base.

Figure 5:
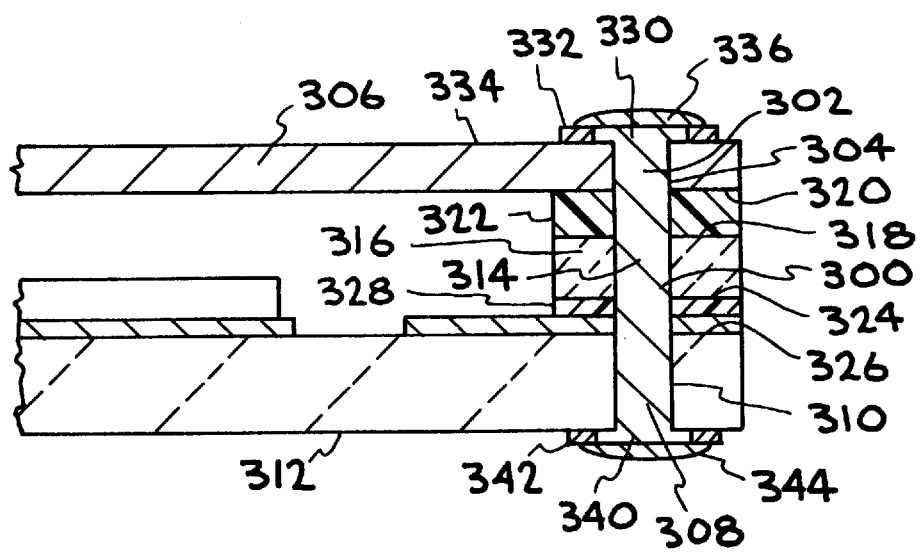
FIG. 5 is a partial sectional view of a portion of a package configuration which uses a reinforcement pin which extends through lid and the base of a package, where the ends of the pin are sealed with a sealing material.

The reinforcement pins have much greater shear strength than a layer of solder or epoxy material. The reinforcement pins therefore serve to prevent catastrophic failure of the weaker package sealing layer during operating conditions such as are tested by pressure pot or temperature cycling tests, where the sealing layer is likely to fail in a shear mode. The reinforcement pins pull the lid and the base together and provide additional sealing of the package FIG. 5 shows another embodiment of the invention which uses a longer reinforcement pin 300. One end 302 of the pin 300 extends completely through an aperture 304 formed through a lid member 306. The other end 308 of the pin 300 extends completely through an aperture 310 formed through a base member 312. The intermediate portion 314 of the pin 300 extends through a sealing ring 316. The top surface 318 of the sealing ring 316 is sealed to the underside 320 of the lid member 306 with a sealing layer 322. The lower surface 324 of the sealing ring 316 is sealed to the upper surface 326 of a metal layer 326 formed on the top surface of the base member 312, as indicated in the Figure.

The pin 300 can be press-fit and its ends stamped, punched, or rolled over with a press. The tip 330 of the one end 302 of the pin 300 is shown rolled over, as indicated in FIG. 5. A gold-plated, metallized pad 332 is provided on the top, outside surface 334 of the lid member 306. The tip 330 of the pin 300 is sealed to the lid member 306 with a blob 336 of sealing material. If the blob 336 is solder, the metallized pad 332 provides a surface for the solder. Alternatively, the blob of sealing material can be formed of glass or epoxy material.

The base member 312 of the package is optionally formed of a number of materials, depending on the package type. Material for the base include, for example, metal, ceramic, and circuit board materials, such as epoxy glass or FR4 material.

The other tip 340 at the other end 308 of the pin 300 is also rolled over, as indicated in the Figure. A gold-plated, metallized pad 342 is also provided, as required, on the bottom surface 342 of the base member 312. The other tip 340 of the pin 300 is sealed to the base member 312 with a blob 344 of sealing material. If the blob 344 is solder, the metallized pad 342 provides a wettable surface for the solder. Alternatively, the blob of sealing material can be formed of glass or epoxy material.

Figure 6:
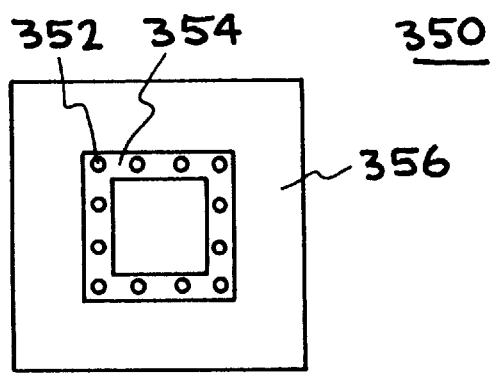
FIG. 6 is a top view of a pin-grid-array PGA) package configuration, in which a number of reinforcement pins secure a lid to a base of a package.

FIG. 6 shows in reduced scale a pin-grid-array PGA package configuration 350, in which a number of reinforcement pins 352 secure a lid 354 to a base 356.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the Claims appended hereto and their equivalents.

What is claimed is:

1. A method of packaging an integrated circuit, comprising the steps of:
   mounting an integrated-circuit die to a base member of a package;
   positioning a lid over said integrated-circuit die mounted to said base of said package;
   sealing between said base and said lid with a sealing layer; and
   reinforcing said sealing layer against shear forces occurring between said base and said lid by extending at least one one-piece cylindrical reinforcement pin through said sealing layer and at least partially through said base and at least partially through said lid to mechanically hold said base and said lid together and to provide reinforcement for said sealing layer between said base and said lid, such that the shear strength of the reinforcement pin is much greater than the shear strength of the sealing layer.

2. The method of claim 1 including the step of extending a plurality of one-piece cylindrical reinforcement pins through said sealing layer and at least partially through said base and at least partially through said lid to mechanically hold said base and said lid together and to provide reinforcement for said sealing layer against shearing forces between said base and said lid, such that the shear strength of the reinforcement pin is much greater than the shear strength of the sealing layer.

3. The method of claim 1 including the step of
   mounting said integrated-circuit die within a cavity formed in said base of said package; and
   positioning a lid over said integrated-circuit die mounted within said cavity formed in said base of said package.

4. The method of claim 1 wherein the step of extending at least one one-piece cylindrical reinforcement pin through said sealing layer and at least partially through said base and at least partially through said lid to mechanically hold said base and said lid together includes extending said one-piece cylindrical reinforcement pin at least partially through an undersize aperture in said base and at least partially through an undersize aperture in said lid to secure said one-piece cylindrical pin to said base and said lid.

5. The method of claim 1 wherein the step of mechanically holding said base and said lid together includes extending said one-piece cylindrical reinforcement pin through said first sealing layer and through said base and exposing a first end of said one-piece cylindrical reinforcement pin.

6. The method of claim 5 including fixing the first end of said one-piece cylindrical reinforcement pin to said base.

7. The method of claim 6 wherein the step of fixing the first end of said one-piece cylindrical pin to said base includes soldering the first end of said one-piece cylindrical pin to said base.

8. The method of claim 6 wherein the step of fixing the first end of said one-piece cylindrical pin to said base includes sealing the first end of said one-piece cylindrical pin with a glass material.

9. The method of claim 6 wherein the step of fixing the first end of said one-piece cylindrical pin to said base includes sealing the first exposed end of said one-piece cylindrical pin with an epoxy material.

10. The method of claim 5 wherein the step of mechanically holding said base and said lid includes extending said one-piece cylindrical pin through said first sealing layer and through said lid to provide a second exposed end of said one-piece cylindrical pin.

11. The method of claim 10 including fixing the second exposed end of said one-piece cylindrical pin to said lid.

12. The method of claim 11 wherein the step of fixing the second exposed end of said one-piece cylindrical pin to said lid includes soldering the second exposed end of said one-piece cylindrical pin to said lid.

13. The method of claim 11 wherein the step of fixing the second exposed end of said one-piece cylindrical pin to said lid includes sealing the second exposed end of said one-piece cylindrical pin with a glass material.

14. The method of claim 11 wherein the step of fixing the second exposed end of said one-piece cylindrical pin to said lid includes sealing the second exposed end of said one-piece cylindrical pin with an epoxy material.

15. The method of claim 1 including the steps of
   positioning a sealing ring on said base, said sealing ring having a top sealing surface and a bottom sealing surface;

sealing between said base and said bottom sealing surface of said sealing ring with a first layer of sealing material;

positioning a lid on said top sealing surface of said sealing ring;

sealing between said top sealing surface of said sealing ring and said lid with a second layer of sealing material; and reinforcing said sealing layer against shear forces occurring between said base and said lid by mechanically holding said base, said sealing ring, and said lid together with a one-piece cylindrical pin, said one-piece cylindrical pin extending through an aperture formed in said sealing ring, said one-piece cylindrical pin extending through said first layer of sealing material and at least partially into said base, and said one-piece cylindrical pin extending through said second layer of sealing material and at least partially into said lid, such that the shear strength of the reinforcement pin is much greater than the shear strength of the sealing layer.

16. A method of packaging an integrated circuit, comprising the steps of:

mounting an integrated-circuit die to a base member of a package;

positioning a lid over said integrated-circuit die mounted to said base of said package;

sealing between said base and said lid with a sealing layer; and reinforcing said sealing layer against shear forces occurring between said base and said lid by extending at least one one-piece cylindrical reinforcement pin through said sealing layer and at least partially through said base and at least partially through said lid to mechanically hold said base and said lid together and to provide reinforcement of shear strength between said base and said lid, such that the shear strength of the reinforcement pin is much greater than the shear strength of the sealing layer.

* * * * *